(12) United States Patent
Kogure et al.

(10) Patent No.: US 9,307,681 B2
(45) Date of Patent: Apr. 5, 2016

(54) POWER CONVERTER INCLUDING SEMICONDUCTOR MODULE AND COOLER

(71) Applicant: DENSO CORPORATION, Kariya, Aichi-pref. (JP)

(72) Inventors: Shintarou Kogure, Kariya (JP); Hiroshi Inamura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 186 days.

(21) Appl. No.: 14/066,022

(22) Filed: Oct. 29, 2013

(65) Prior Publication Data

US 2014/0118933 A1    May 1, 2014

(30) Foreign Application Priority Data

Oct. 29, 2012    (JP) .................................. 2012-238036

(51) Int. Cl.
| | |
|---|---|
| *H05K 7/20* | (2006.01) |
| *H01L 23/473* | (2006.01) |
| *H01L 23/40* | (2006.01) |
| *F16L 41/08* | (2006.01) |

(52) U.S. Cl.
CPC .......... *H05K 7/20927* (2013.01); *F16L 41/088* (2013.01); *H01L 23/473* (2013.01); *H01L 23/4012* (2013.01); *H01L 2924/0002* (2013.01)

(58) Field of Classification Search
CPC ........... H05K 7/20927; H05K 7/20936; H01L 23/473; H01L 23/4012; F16L 41/088
USPC ................... 361/699; 165/80.4–80.5, 104.33; 257/714; 363/141; 16/2.2; 174/153 G
See application file for complete search history.

(56) References Cited

U.S. PATENT DOCUMENTS

| 4,041,241 | A | * | 8/1977 | Olmstead et al. .......... 174/153 G |
| 5,954,345 | A | * | 9/1999 | Svoboda et al. .............. 277/626 |
| 7,200,007 | B2 | * | 4/2007 | Yasui et al. ................... 361/716 |
| 8,929,097 | B2 | * | 1/2015 | Nakasaka et al. ............. 361/831 |
| 2013/0075980 | A1 | | 3/2013 | Yamamoto et al. | |

FOREIGN PATENT DOCUMENTS

| JP | 2011-086761 | 4/2011 |
| JP | 2011-171449 | 9/2011 |
| WO | 2011/158750 | 12/2011 |

OTHER PUBLICATIONS

Office Action (2 pgs.) dated Sep. 30, 2014 issued in corresponding Japanese Application No. 2012-238036 with an at least partial English language translation thereof (2 pgs.).

* cited by examiner

*Primary Examiner* — Zachary M Pape
(74) *Attorney, Agent, or Firm* — Nixon & Vanderhye P.C.

(57) ABSTRACT

A power converter including a semiconductor module; a cooler having a pair of coolant pipes; a casing provided with a pair of openings, housing the semiconductor module and the cooler; and a pair of grommets being fitted to the pair of openings where the pair of coolant pipes are inserted into the pair of grommets. Each of the grommet includes: a grommet body having a through hole through which a corresponding coolant pipe is inserted and a sealing surface that intimately contacts an inner peripheral surface of a corresponding opening; and a guide provided to one end of the grommet body, with respect to a direction of inserting the coolant pipe, so as to be projected outward further than the sealing surface. Each of the grommet is embedded with a reinforcement member with at least a part of the reinforcement member being located in the guide.

4 Claims, 10 Drawing Sheets

POWER CONVERTER INCLUDING SEMICONDUCTOR MODULE AND COOLER

CROSS-REFERENCE TO RELATED APPLICATION

This application is based on and claims the benefit of priority from earlier Japanese Patent Application No. 2012-238036 filed Oct. 29, 2012, the description of which is incorporated herein by reference.

BACKGROUND

1. Technical Field

The present disclosure relates to a power converter that includes semiconductor modules and a cooler.

2. Related Art

Electric vehicles or hybrid vehicles, for example, are equipped with a power converter, such as an inverter. A patent document JP-A-2011-086761 discloses a power converter having a configuration in which semiconductor modules and coolant passages of a cooler are alternately stacked so that each semiconductor module can be cooled from both of its principal surfaces. The power converter disclosed in JP-A-2011-086761 is enhanced in its output by enhancing the cooling performance and efficiently removing the heat generated by the semiconductor modules.

Further, the power converter disclosed in JP-A-2011-086761 includes waterproof grommets. The waterproof grommets, in a state where a pair of coolant charge/discharge pipes are passed therethrough, are fitted to cuttings formed in a casing. With this configuration, water-tightness of the casing is enhanced and moisture is prevented from entering the casing. In addition, the grommets each have an outer peripheral surface in which a pair of ribs are formed being projected outward, the ribs being arranged confronting the inner and outer surfaces of the casing.

However, the grommets used in the power converter disclosed in JP-A-2011-086761 are made of an elastic material, such as rubber. Therefore, when the grommets are fitted to the respective cuttings of the casing, there is a concern that the ribs may be deformed depending on the way of performing the fitting operation. Thus, in some instances, in fitting each grommet to the casing, the ribs may be caught between the sealing surface of the grommet and the inner peripheral surface of the cutting. In this case, there is a concern that the sealing surface of the grommet will not be in sufficiently close contact with the inner peripheral surface of the cutting and the water-tightness of the casing will be impaired. Further, when the ribs are caught between the sealing surface and the inner peripheral surface of the cutting, the assemblage has to be done all over again, impairing productivity of the power converter. Thus, productivity of the power converter has long been desired to be more enhanced.

SUMMARY

It is thus desired to provide a power converter that can ensure good productivity and has high water-tightness.

The embodiment provides a power converter including a semiconductor module; a cooler that cools the semiconductor module, the cooler having a pair of coolant pipes that charge/discharge a coolant; a casing provided with a pair of openings, housing the semiconductor module and the cooler in an interior thereof while having the pair of coolant pipes projected out of the pair of openings; and a pair of grommets made of an elastic material, being fitted to the pair of openings where the pair of coolant pipes are interested into the pair of grommets. Each of the grommet includes: a grommet body having a through hole through which a corresponding coolant pipe is inserted and a sealing surface which is configured to intimately contact an inner peripheral surface of a corresponding opening; and a guide provided to one end of the grommet body, with respect to a direction of inserting the coolant pipe, so as to be projected outward further than the sealing surface. Moreover, each of the grommet is embedded with a reinforcement member made of a ferrous material, with at least a part of the reinforcement member being located in the guide.

In the power converter, each of the grommets is embedded with the reinforcement member made of metal and at least a portion of the reinforcement member is arranged in the guide. Being embedded with the reinforcement member, the guide is unlikely to be deformed when the grommet is fitted to the corresponding opening. Therefore, the guide of each grommet is prevented from being jammed in the sealing surface in fitting the grommet to the corresponding opening. As a result, in the power converter, the intimacy of contact is easily enhanced between the sealing surface of each grommet and the inner peripheral surface of the corresponding opening, thereby enhancing the water-tightness of the power converter.

Further, since the guide is hardly deformed, each grommet can be easily placed in position while being fitted to the respective opening being led by the guide. As a result, the number of times of reassemblage will be reduced and accordingly, productivity of the power converter can be enhanced.

According to the aspect described above, a power converter having good productivity and high water-tightness can be provided.

DETAILED DESCRIPTION OF THE PREFERRED EMBODIMENTS

With reference to the accompanying drawings, hereinafter are described several embodiments of the present disclosure.

(First Embodiment)

Figure 2:
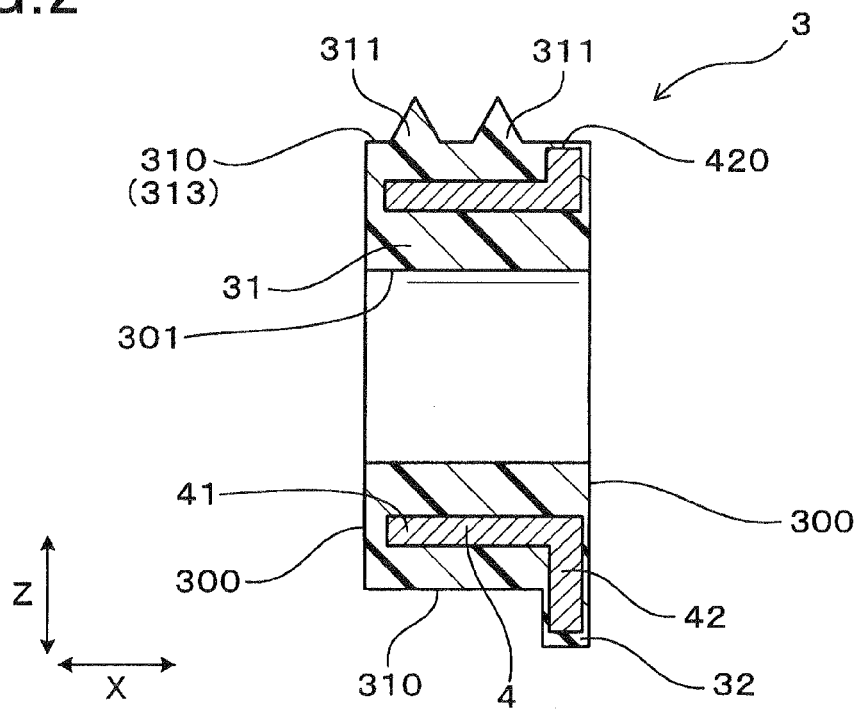
FIG. 2 is a cross-sectional view taken along a line II-II of FIG. 1.
Figure 3:
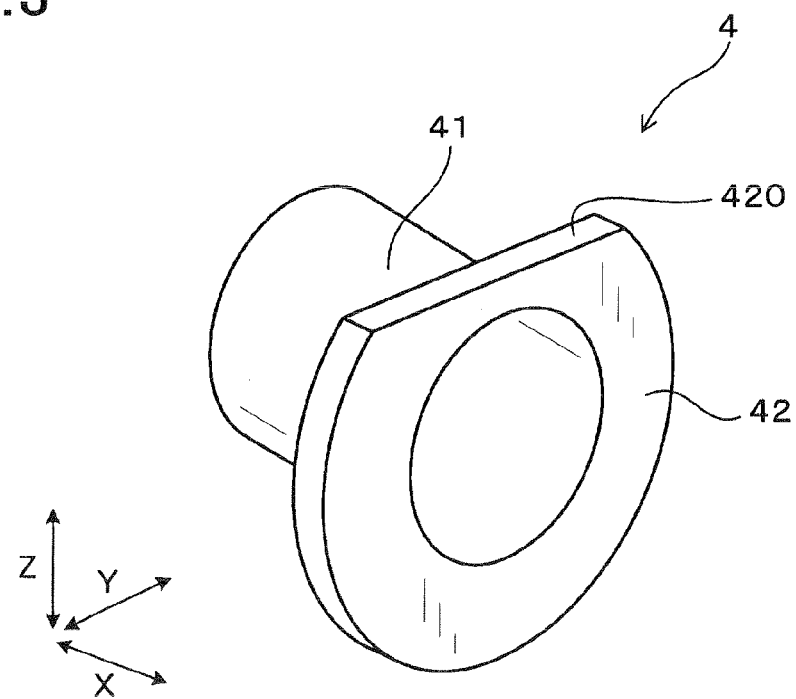
FIG. 3 is a perspective view illustrating a reinforcement member, according to the first embodiment.
Figure 4:
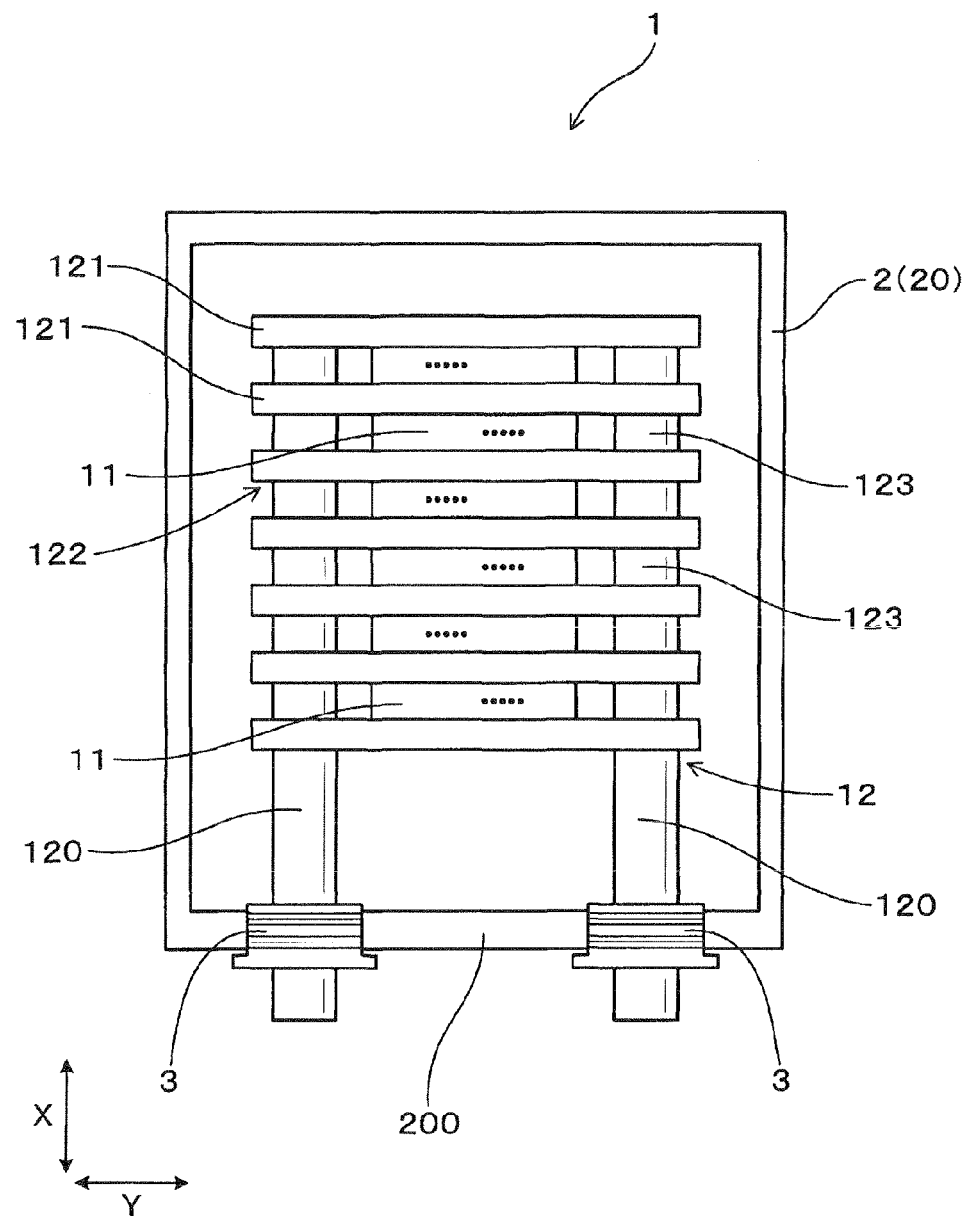
FIG. 4 is a plan view illustrating a power converter, as viewed from a direction of fitting the grommet (height direction), according to the first embodiment.

Referring to FIGS. 1 to 6, hereinafter is described a power converter 1 according to a first embodiment of the present disclosure. FIG. 4 is a plan view illustrating the power converter 1, as viewed from a height direction, according to the first embodiment. As shown in FIG. 4, the power converter 1 includes a plurality of semiconductor modules 11, a cooler 12, a casing 2 and a pair of grommets 3.

As shown in FIG. 4, the cooler 12 includes a pair of coolant charge/discharge pipes (hereinafter also just referred to as "coolant pipes") 120 that charges/discharges a coolant and has a function of cooling the semiconductor modules 11.

Figure 5:
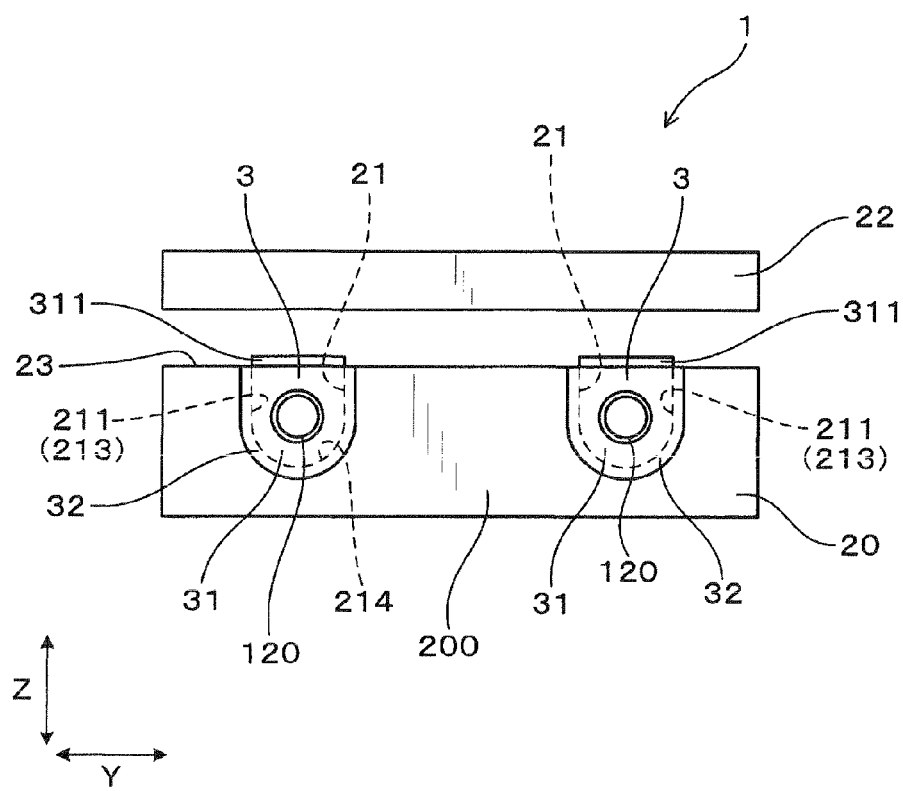
FIG. 5 is a plan view illustrating the power converter, as viewed from a direction in which the coolant charge/discharge pipe is projected (stacking direction), according to the first embodiment.

FIG. 5 is a plan view illustrating the power converter 1, as viewed from a direction in which the coolant pipes 120 are projected. As shown in FIGS. 4 and 5, the casing 2 is provided with a pair of openings 21. While having the pair of coolant pipes 120 projected out of the pair of openings 21, the casing 2 houses the semiconductor modules 11 and the cooler 12 in the interior. The pair of grommets 3 are made of an elastic material. As shown in FIGS. 4 and 5, the coolant pipes 120 are inserted into the respective grommets 3, and in this state, the grommets 3 are fitted to the respective openings 21.

Figure 1:
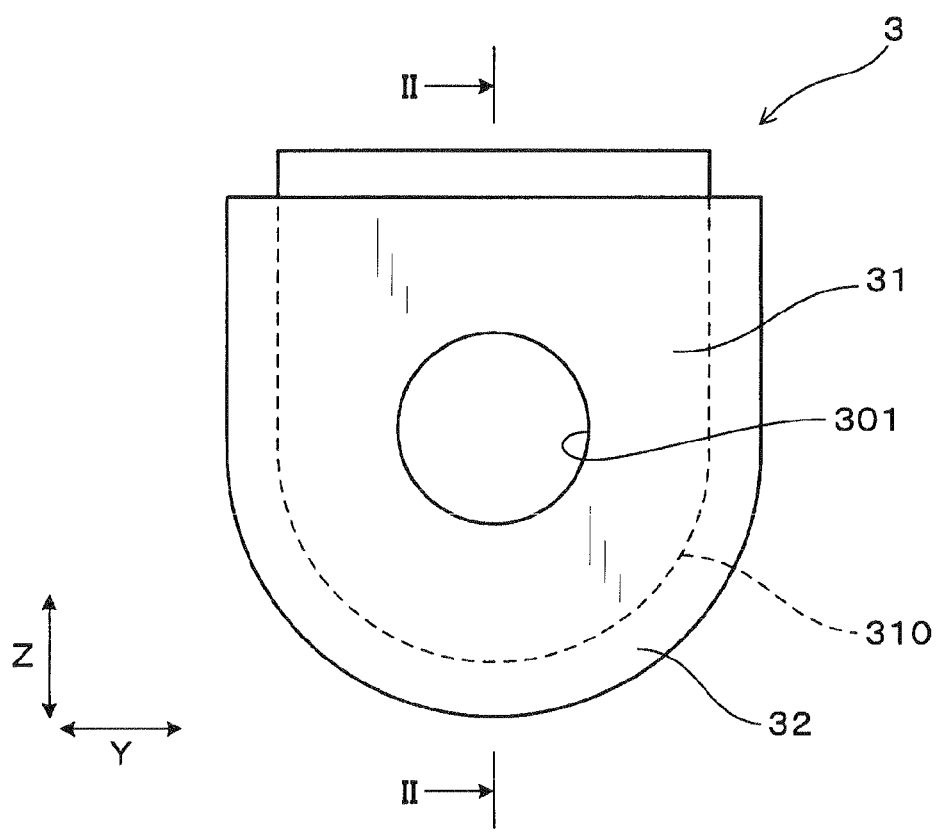
FIG. 1 is a plan view illustrating a grommet, as viewed from a direction in which a coolant charge/discharge pipe is projected (stacking direction), according to a first embodiment of the present disclosure.

FIG. 1 is a plan view illustrating the grommet 3, as viewed from a direction in which the coolant pipe 120 is projected. FIG. 2 is a cross-sectional view taken along a line II-II of FIG. 1. As shown in FIGS. 1 and 2, each grommet 3 includes a grommet body 31 and a guide 32. The grommet body 31 has a through hole 301 through which the corresponding coolant pipe 120 is inserted, and a sealing surface 310 which is configured to intimately contact an inner peripheral surface 213 of the corresponding opening 21. The guide 32 is provided to one end of the grommet body 31, with respect to the direction of inserting the coolant pipe 120, so as to be projected outward further than the sealing surface 310. As shown in FIG. 2, each grommet 3 is embedded with a reinforcement member 4 made of a ferrous material, with at least a part of the reinforcement member 4 being located in the guide 32.

Hereinafter, the power converter 1 is specifically described. As shown in FIG. 4, the power converter 1 includes the casing 2 in a substantially parallelopiped shape in which the semiconductor modules 11 and the cooler 12 are housed.

The casing 2 has a wall surface from which the pair of coolant pipes 120 are unidirectionally projected (hereinafter, the direction in which the coolant pipes 120 are projected (longitudinal direction) is referred to as "stacking direction X").

The coolant pipes 120 are juxtaposed in a direction perpendicular to the stacking direction X (hereinafter, the direction in which the coolant pipes 120 are juxtaposed is referred to as "width direction Y", and a direction perpendicular to both of the stacking direction X and the width direction Y is referred to as "height direction Z").

Figure 6:
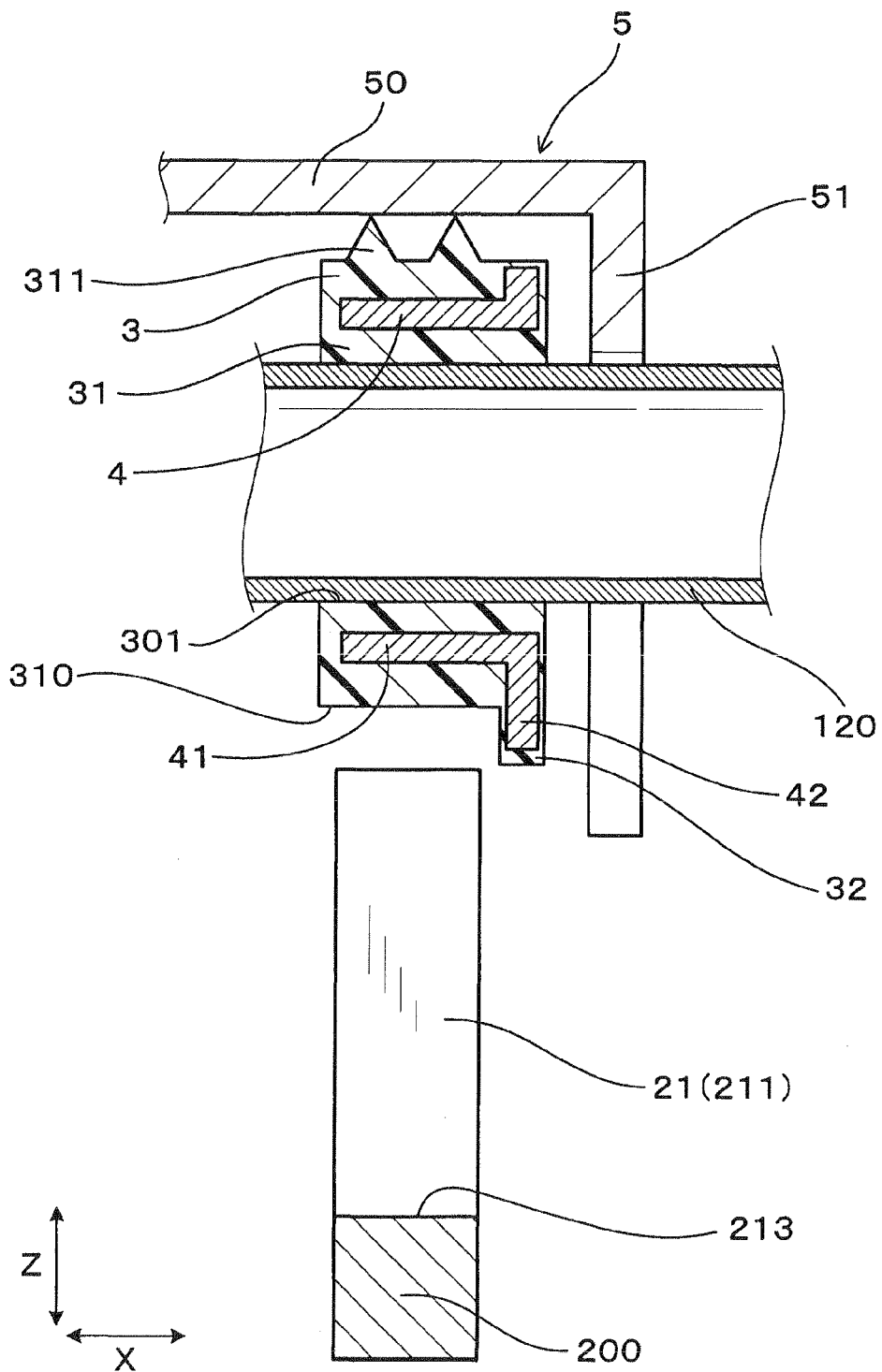
FIG. 6 is an explanatory view illustrating how the grommet is fitted to an opening, according to the first embodiment.

As shown in FIG. 5, the casing 2 includes a casing body 20 and a casing cover 22, which are assembled so as to form the pair of openings 21 therebetween. The casing body 20 has a mating surface 23 via which the casing body 20 is assembled to the casing cover 22. The casing body 20 also has a pair of U-shaped recesses 211 which are cut in the mating surface 23. FIG. 6 is an explanatory view illustrating how the grommet 3 is fitted to the opening 21. As shown in FIG. 6, each grommet 3 is fitted to the corresponding recess 211. As shown in FIG. 5, each recess 211 has an end that is a curved surface 214 in which the guide 32 of the grommet 3 is arranged.

In the present embodiment, the casing body 20 is substantially in a parallelopiped shape with its one face in the height direction Z being open. As shown in FIG. 5, the casing cover 22 is assembled to the casing body 20 from the open face side. The casing body 20 has a side wall 200 at an end in the stacking direction X, in which the pair of recesses 211 are formed. Thus, the pair of openings 21 are defined by the respective inner peripheral surfaces 213 of the pair of recesses 211 and the mating surface 23 via which the casing body 20 and the casing cover 22 are assembled. The grommets 3, through which the respective coolant pipes 120 are inserted, are arranged in the pair of openings 21.

Each grommet 3 is embedded with the reinforcement member 4 made of ethylene propylene rubber (EPDM). Each grommet 3 also includes the grommet body 31 and the guide 32 which is arranged at an end of the grommet body 31 in the stacking direction X. As shown in FIG. 1, each grommet 3 has a substantially U-shaped contour as viewed from the stacking direction X. Further, as shown in FIG. 4, each grommet 3 has a thickness which is larger than that of the side wall 200 of the casing body 20.

The grommet body 31 is in a U shape, as viewed from the stacking direction X, the shape being slightly larger than that of the recess 211. As shown in FIG. 2, the grommet body 31 includes a pair of principal surfaces 300 in the stacking direction X, defining an outer peripheral portion therebetween, which is ensured to function as the sealing surface 310. Specifically, in fitting each grommet 3 to the corresponding recess 211, the sealing surface 310 of the grommet body 31 is ensured to intimately contact the inner peripheral surface 213 of the recess 211. In the present embodiment, in order to enhance water-tightness, two projections 311 that are parallel to each other in the width direction Y are formed in a portion of the grommet body 31, which portion is brought into contact with the casing cover 22, i.e. formed in a portion 313 opposite to a curved portion of the sealing surface 310.

As shown in FIGS. 1 and 2, the guide 32 is projected outward further than the sealing surface 310. Specifically, as shown in FIG. 5, in a state of being fitted to the recess 211, the guide 32 is projected along the surface of the side wall 200 of the casing body 20 to cover the edge of the recess 211.

Further, as shown in FIGS. 1 and 2, each grommet body 31 has a center portion in which the through hole 301 is formed for the insertion of the coolant pipe 120 from the stacking direction X. The through hole 301 is formed such that its diameter will be slightly smaller than the outer diameter of the coolant pipe 120. Thus, as shown in FIG. 6, in a state where the coolant pipe 120 is inserted and fitted into the through hole 301, the grommet 3 is ensured to be elastically deformed to bring the inner peripheral surface of the through hole 301 into intimate contact with the outer peripheral surface of the coolant pipe 120.

As shown in FIGS. 2 and 3, each grommet 3 is embedded with the reinforcement member 4 made of a ferrous material. The reinforcement member 4 includes a cylindrical body 41 in a cylindrical shape, and a flange 42 that is formed being projected radially outward from an end of the cylindrical body 41. The flange 42 of the reinforcement member 4 is formed throughout the circumference at one end of the cylindrical body 41. The flange 42 has a portion that is a sole flat portion 420 which is formed so as to be perpendicular to the radial direction of the cylindrical body 41. Thus, the flange 42 of the reinforcement member 4 of the present embodiment is not configured to be rotationally symmetric about the center axis of the cylindrical body 41. Instead, the flange 42 is configured to be non-uniformly projected from the cylindrical body 41, as viewed in the cross section that passes through the center of the flat portion 420 and the center axis of the cylindrical body 41.

As shown in FIG. 2, the reinforcement member 4 is embedded in the elastic material of the grommet 3 so that the cylindrical body 41 is located in the grommet body 31 and the flange 42 is located in the guide 32.

Specifically, the flange 42 of the reinforcement member 4 is arranged, being extended over both of the guide 32 and the grommet body 31. Further, the reinforcement member 4 is arranged such that the through hole 301 is located inside the cylindrical body 41 and the flat portion 420 of the flange 42 is positioned confronting the sealing surface 310 in which the projections 311 are formed.

Each semiconductor module 11 incorporates one switching element composed such as of IGBT (insulated gate bipolar transistor) or MOSFET (metal-oxide semiconductor field effect transistor). As shown in FIG. 4, the plurality of semiconductor modules 11 are aligned in the stacking direction X such that one semiconductor module 11 is arranged between adjacent cooling pipes 121 of the cooler 12 that will be describe later. Each semiconductor module 11 is sandwiched, from both of its principal surfaces, between a pair of cooling pipes 121. Thus, the plurality of cooling pipes 121 and the plurality of semiconductor modules 11 are alternately stacked to configure a stack 122.

As shown in FIG. 4, in the cooler 12, the plurality of cooling pipes 121, through which a coolant is passed, are aligned in the stacking direction X with a predetermined interval therebetween. At the same time, adjacent cooling pipes 121 are connected to each other at both end portions thereof in the longitudinal direction (width direction Y) via a connecting pipe 123. The pair of coolant pipes 120 are connected to the longitudinal ends of a cooling pipe 121 which is arranged at an end of the stack 122 with respect to the stacking direction X. As shown in FIG. 4, the pair of coolant pipes 120 are extended out of the casing 2 from the cooling pipe 121 as a base, which is arranged on the side wall 200 side in the stack 122 with respect to the stacking direction X.

In the cooler 12 configured as described above, the coolant that has been charged into one coolant pipe 120 is passed through the connecting pipes 123 and then distributed to and passed through the individual cooling pipes 121 in the longitudinal direction. While being passed through the cooling pipes 121, the coolant exchanges heat with the semiconductor modules 11. After being increased in temperature as a result of the heat exchange, the coolant is passed through the connecting pipes 123 on the downstream side, introduced into the other coolant pipe 120 and discharged from the cooler 12.

Hereinafter is described how the grommets 3 are fitted to the respective recesses 211. As shown in FIG. 6, the pair of grommets 3 are mounted to the cooler 12 by inserting the coolant pipes 120 into the through holes 301 so that the guides 32 will be located outside the casing 2. Then, the semiconductor modules 11 assembled in advance to form the stack 122, and the cooler 12 are located so as to be housed in the casing body 20, while the pair of grommets 3 are pressed in the height direction Z toward the pair of recesses 211 and fitted thereto.

As shown in FIG. 5, each fitted grommet 3 is arranged so that the portion 313, which is opposed to the curved portion of the sealing surface 310, is flush with the side wall 200 of the casing body 20. After the grommets 3 are fitted to the recesses 211, the projections 311 of the grommets 3 will be in a state of being projected further than the side wall 200 in the height direction Z.

As shown in FIG. 6, in fitting the grommets 3 to the recesses 211, a jig 5 is used to concurrently perform fitting and positioning of the grommets 3. For example, as shown in FIG. 6, the jig 5 is formed into the shape of an L as viewed from the width direction Y. The jig 5 includes a pressing portion 50 extended in the stacking direction X, and a positioning portion 51 formed by bending an end of the pressing portion 50 in the height direction Z. Then, in a state where the guides 32 are arranged between the positioning portion 51 and the side wall 200, the grommets 3 are pressed by the pressing portion 50 in the height direction Z, so that the grommets 3 are ensured to be fitted to the respective recesses 211. Thus, the position of each of the guides 32 in the stacking direction X is restricted to the position between the positioning portion 51 and the side wall 200, thereby concurrently performing fitting and positioning of the grommets 3.

The following are advantageous effects of the present embodiment. Each grommet 3 is embedded with the reinforcement member 4 made of metal, with at least a portion of which being located in the guide 32. Being embedded with the reinforcement member 4, the guide 32 is hardly deformed when the grommet 3 is fitted to the corresponding recess 211 that configures the opening 21. Therefore, in fitting the grommet 3 into the corresponding recess 211, the guide 32 is prevented from being jammed in the sealing surface 310. As a result, in the power converter 1 having the grommets 3, the intimacy of contact is easily enhanced between the sealing surface 310 of each grommet 3 and the inner peripheral surface 213 of the corresponding recess 211. As a result, water-tightness of the power converter 1 is enhanced.

As described above, since the guides 32 are hardly deformed, positioning of the grommets 3 can be easily performed by fitting the grommets 3 to the respective recesses 211 while being led by the guides 32. As a result, the number of times of reassemblage will be reduced and accordingly, productivity of the power converter 1 can be enhanced.

The reinforcement member 4 is located being extended over both of the guide 32 and the grommet body 31. Accordingly, in fitting each of the grommets 3 to the corresponding recess 211, the force of deforming the guide 32 can be dispersed to the grommet body 31 via the reinforcement member 4. As a result, the guide 32 is more unlikely to be deformed and accordingly water-tightness of the power converter 1 is more enhanced.

The reinforcement member 4 includes the cylindrical body 41 located in the grommet body 31, and the flange 42 projected outward from one end of the cylindrical body 41. The flange 42 is formed throughout the circumference at an end of the cylindrical body 41. Accordingly, as mentioned above, the strength of the reinforcement member 4 is more enhanced to more effectively reinforce the guide 32. Further, being reinforced by the cylindrical body 41, the grommet body 31 is hardly deformed. Therefore, in each grommet 3, intimacy of contact is more enhanced between the sealing surface 310 of the grommet 31 and the inner peripheral surface 213 of the corresponding recess 211, and between the inner peripheral surface of the through hole 301 and the outer peripheral surface of each coolant pipe 120. As a result, the water-tightness of the power converter 1 is more enhanced.

The guides 32 are arranged outside the casing 2. Thus, each of the guides 32 is arranged covering the edge of the corresponding recess 211 and accordingly water-tightness of the power converter 1 is more enhanced. Further, after fitting the grommets 3 to the respective recesses 211, the guides 32 can be easily confirmed not to have been deformed. Therefore, the power converter 1 is ensured to have good productivity.

The casing 2 includes the casing body 20 and the casing cover 22 which are assembled to each other, forming a pair of openings 21 therebetween. The casing body 20 has the mating surface 23 via which the casing body 20 is assembled to the casing cover 22. In the mating surface 23, the pair of recesses 211 are formed, each being cut into the shape of an L. Each of the guides 32 is located along the curved surface 214 at an end of the corresponding recess 211. In this case, since the recess 211 is in a shape having no corner, the intimate contact is more enhanced between the sealing surface 310 of the grommet 3 and the inner peripheral surface 213 of the recess 211. As a result, water-tightness of the power converter 1 is more enhanced.

In the present embodiment, the flange 42 of the reinforcement member 4 is configured to be non-uniformly projected from the cylindrical body 41, as viewed in the cross section that passes through the center of the flat portion 420 and the center axis of the cylindrical body 41. Thus, while the flange 42 is located in the guide 32, the flange 42 on the opposite side of the guide 32 can be projected by a shorter length. As a result, the dimension of each grommet 3 in the height direction Z can be more reduced and the size of the power converter 1 can be easily reduced.

According to the embodiment described above, a power converter having good productivity and high water-tightness can be provided.

(Second Embodiment)

Figure 7:
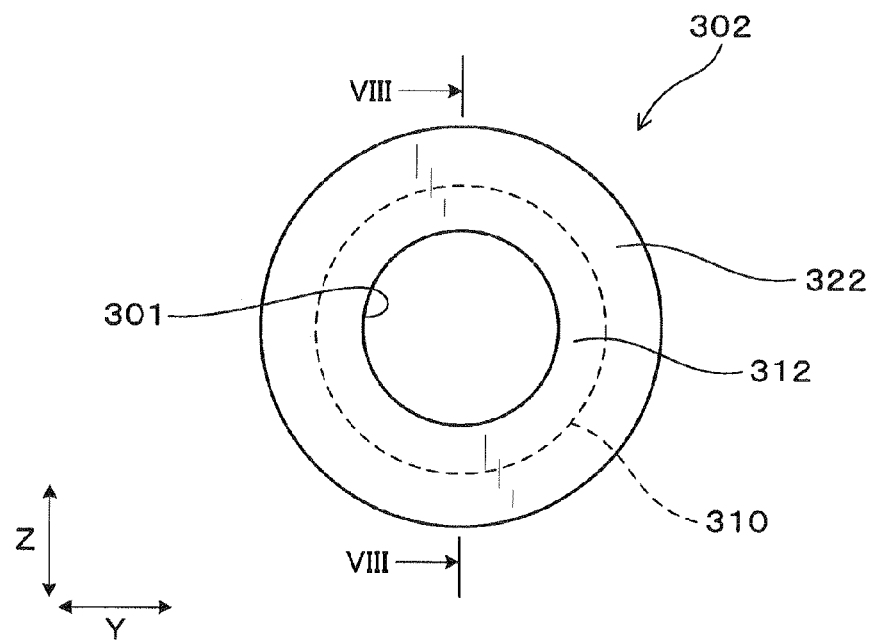
FIG. 7 is a plan view illustrating a grommet arranged in a circular opening, as viewed from a direction in which a coolant charge/discharge pipe is projected (stacking direction), according to a second embodiment of the present disclosure.
Figure 8:
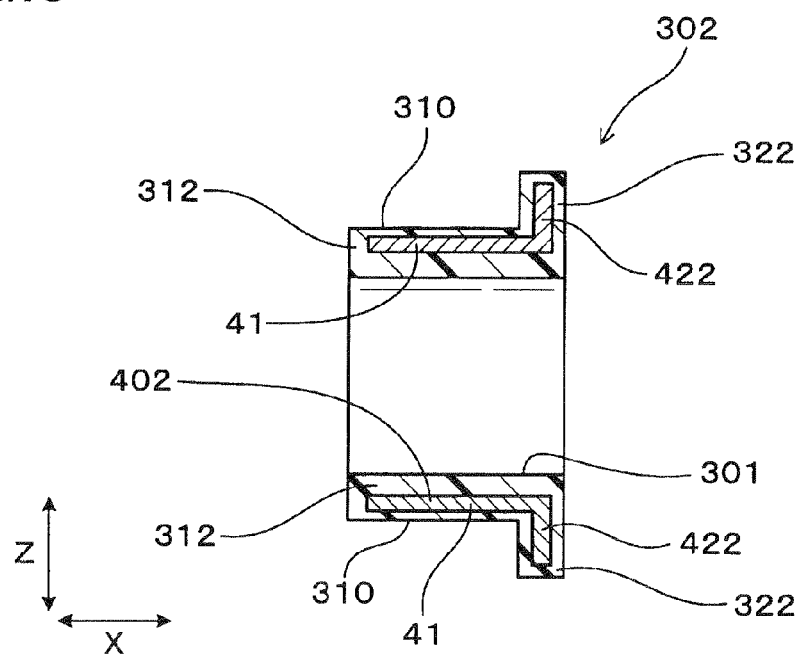
FIG. 8 is a cross-sectional view taken along a line VIII-VIII of FIG. 7.
Figure 9:
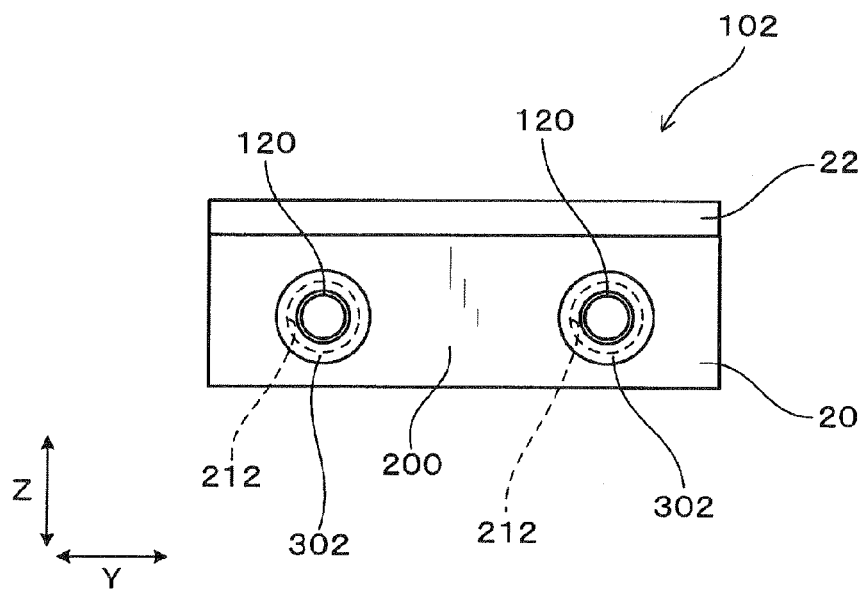
FIG. 9 is a plan view illustrating a power converter, as viewed from a direction in which the coolant charge/discharge pipe is projected (stacking direction), according to the second embodiment.

Referring now to FIGS. 7 to 9, hereinafter is described a power converter 102 according to a second embodiment of the present disclosure. In the second and the subsequent embodiments, the components identical with or similar to those in the first embodiment are given the same reference numerals for the sake of omitting unnecessary explanation.

FIG. 7 is a plan view illustrating a grommet 302 arranged in a circular opening, as viewed from the stacking direction X, according to the second embodiment. FIG. 8 is a cross-sectional view taken along a line VIII-VIII of FIG. 7. FIG. 9 is a plan view illustrating the power converter 102, as viewed from the stacking direction X.

As shown in FIGS. 7 to 9, the power converter 102 of the second embodiment is different from the power converter 1 of the first embodiment in that the shape of the pair of openings 21 has been changed. The power converter 102 of the present embodiment includes a pair of openings 212 each being in a round shape and formed through the side wall 200. As shown in FIG. 9, the grommets 302 are fitted to the pair of openings 212.

As shown in FIGS. 7 and 8, each grommet 302 of the present embodiment includes a grommet body 312 and a guide 322. The grommet body 312 is in a circular shape and fitted to the corresponding opening 212. The guide 322 is formed so as to be projected radially outward from an end of the grommet body 312. The guide 322 is formed throughout the circumference at an end of the grommet body 312.

As shown in FIG. 8, the grommet 302 is embedded with a reinforcement member 402 having the cylindrical body 41 and a flange 422. The cylindrical body 41 is located in the grommet body 312, while the flange 422 is formed throughout the circumference at an end of the cylindrical body 41. Unlike in the reinforcement member 4 of the first embodiment, the flange 422 of the present embodiment is not provided with the flat portion 420 but formed so as to be rotationally symmetric about the center axis of the cylindrical body 41.

In fitting the grommets 302 of the present embodiment to the respective openings 212, the stack 122 of the semiconductor modules 11 and the cooler 12 are housed in the casing body 20, and the coolant pipes 120 are projected from the respective openings 212. After that, while the coolant pipes 120 are inserted into the respective grommets 302, the grommets 302 are fitted to the respective openings 212. The rest of the configuration is similar to that of the first embodiment.

As described above, irrespective of the shape of the pair of openings, use of the grommets, with the guides being embedded with the reinforcement members, can prevent each guide from being jammed in the sealing surface, in fitting the grommets to the respective openings. Other than this, the second embodiment can enjoy the advantageous effects similar to those of the first embodiment.

(Third Embodiment)

Figure 10:
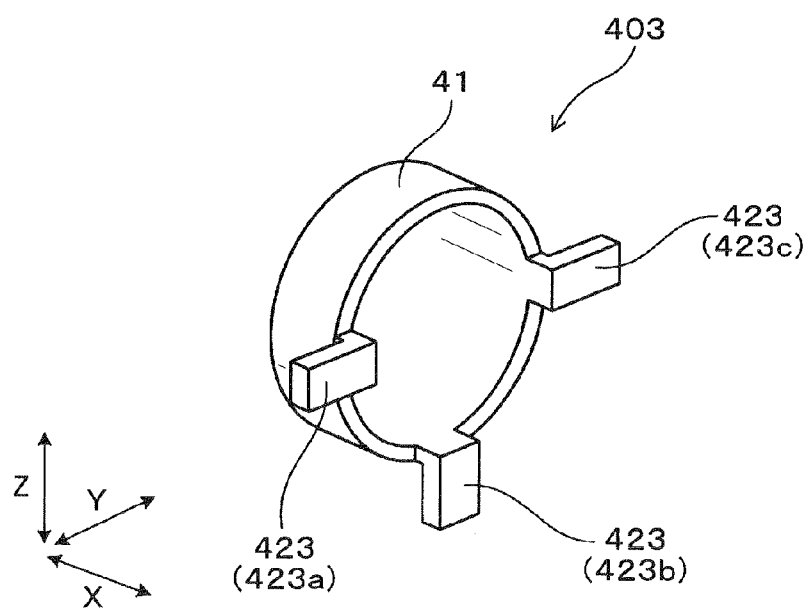
FIG. 10 is a perspective view illustrating a reinforcement member in which flanges are formed, being projected from portions of an open end of a cylindrical body, according to a third embodiment of the present disclosure.

Referring to FIG. 10, a third embodiment of the present disclosure is described. FIG. 10 is a perspective view of a reinforcement member 403 according to the third embodiment. As shown in FIG. 10, the present embodiment is different from the first embodiment in that each grommet of the present embodiment uses the reinforcement member 403 in which the flange 42 of the reinforcement member 4 of the first embodiment has been changed in its shape. As shown in FIG. 10, the reinforcement member 403 has flanges 423 (423a, 423b and 423c) which are formed being projected radially outward from three portions at an end of the cylindrical body 41. Of these flanges 423 formed at the three portions, the flanges 423a and 423c are located at positions that are opposite to each other in the radial direction of the cylindrical body 41. The remaining flange 423b is arranged at a mid position between the two flanges 423a and 423c.

Although not shown, in each grommet, the two flanges 423a and 423c that are mutually on the opposite sides of the reinforcement member 403 are located along the width direction Y. The remaining flange 423b positioned between the flanges 423a and 423b is located along the height direction Z so as to be directed to the curved surface 214 of the recess 211. The rest of the configuration is similar to that of the first embodiment.

As in the present embodiment, if only the flanges 423 are located at at least a part of the guide, the strength of the guide can be reinforced. Thus, the guide of each grommet is prevented from being jammed in the sealing surface in fitting the grommet to the corresponding recess. Other than this, the third embodiment can enjoy the advantageous effects similar to those of the first embodiment.

(Fourth Embodiment)

Figure 11:
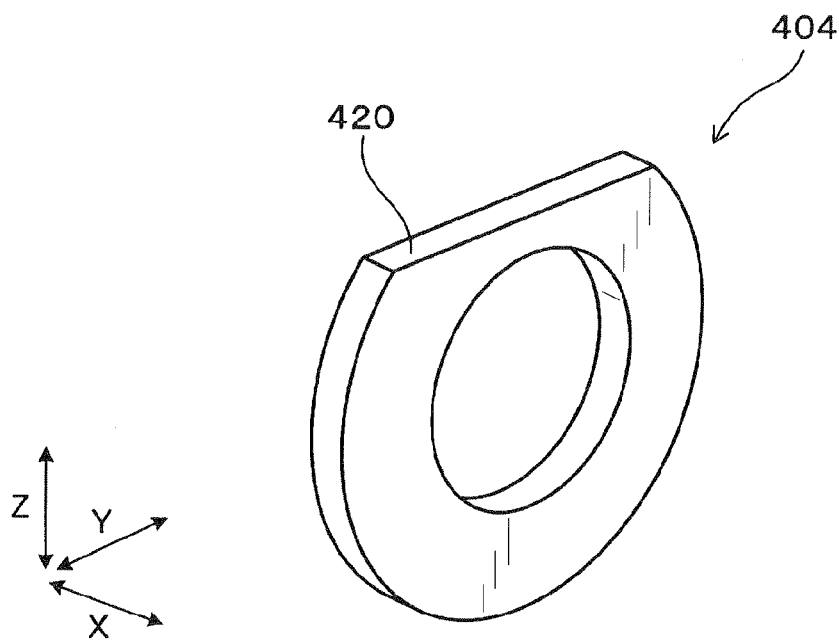
FIG. 11 is a perspective view illustrating a reinforcement member having no cylindrical body, according to a fourth embodiment of the present disclosure.
Figure 12:
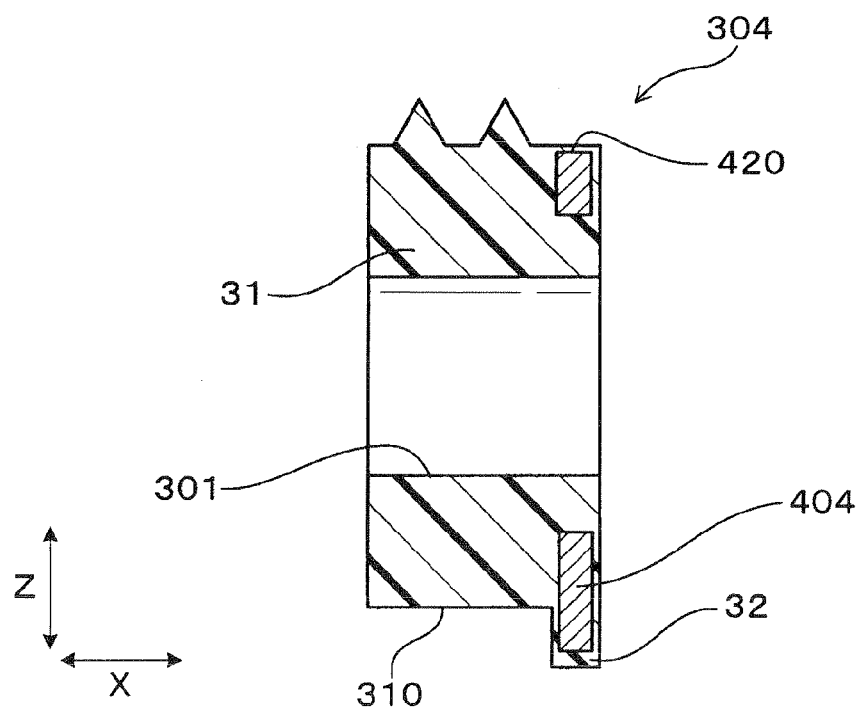
FIG. 12 is a cross-sectional view (corresponding to FIG. 2) illustrating a grommet, according to the fourth embodiment.

Referring to FIGS. 11 and 12, a fourth embodiment of the present disclosure is described. FIG. 11 is a perspective view illustrating a reinforcement member 404 according to the fourth embodiment. FIG. 12 is a cross-sectional view illustrating a grommet 304 according to the fourth embodiment.

As shown in FIGS. 11 and 12, in place of the reinforcement member 4 of the first embodiment, the fourth embodiment uses the reinforcement member 404 having no cylindrical body 41. As shown in FIG. 11, the reinforcement member 404 of the present embodiment includes only the flange 42 of the reinforcement member 4 of the first embodiment. Specifically, the reinforcement member 404 of the present embodiment is substantially in an annular shape and includes one flat portion 420 that is formed so as to be perpendicular to the radial direction of the reinforcement member 404.

As shown in FIG. 12, the reinforcement member 404 is located in the grommet 304, being extended over both of the guide 32 and the grommet body 31. The flat portion 420 of the reinforcement member 404 is located on the projections 311 side of the sealing surface 310. The rest of the configuration is similar to that of the first embodiment.

In the reinforcement member 404 having no cylindrical body 41 as in the present embodiment, if only the reinforcement member 404 is located, being extended over both of the guide 32 and the grommet body 31, the force of deforming the guide 32 in fitting the grommet 304 to the corresponding opening 21 can be dispersed to the grommet body 31 via the reinforcement member 404. As a result, since the guide 32 will be more unlikely to be deformed, water-tightness of the power converter 1 is more enhanced.

(Fifth Embodiment)

Figure 13:
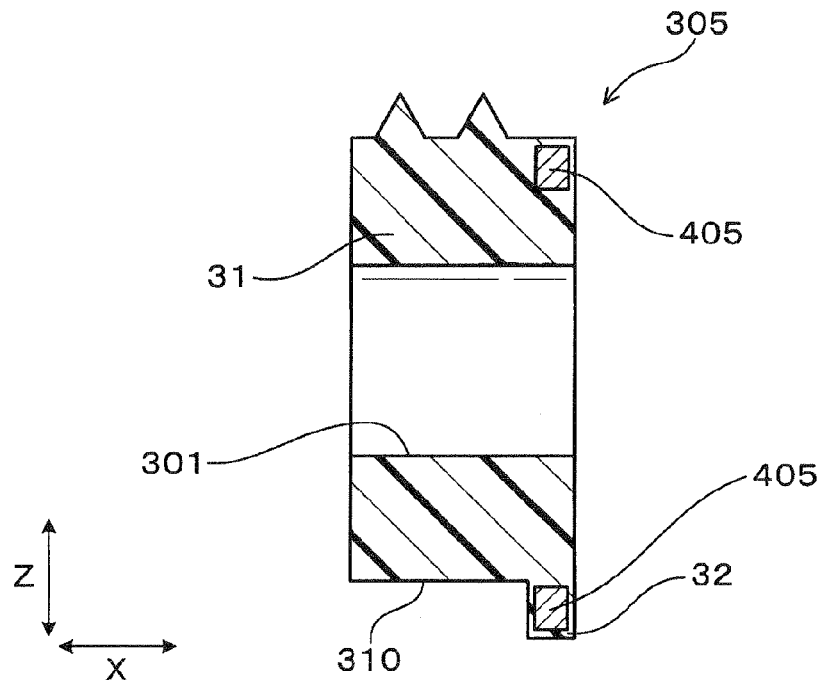
FIG. 13 is a cross-sectional view (corresponding to FIG. 2), illustrating a grommet having a reinforcement member that is arranged only in a guide of the grommet, according to a fifth embodiment of the present disclosure.

Referring to FIG. 13, a fifth embodiment of the present disclosure is described. FIG. 13 is a cross-sectional view, illustrating a grommet 305 according to the fifth embodiment. As shown in FIG. 13, in the grommet 305 of the fifth embodiment, the shape of the reinforcement member 404 of the fourth embodiment has been changed to provide a reinforcement member 405 which is located only in the guide 32. The reinforcement member 405 of the present embodiment is formed into an annular shape so as to be rotationally symmetric about its center. As shown in FIG. 13, the reinforcement member 405 is located only in the guide 32. Specifically, the reinforcement member 405 is not further extended toward the grommet body 31 than the sealing surface 310. The rest of the configuration is similar to that of the fourth embodiment.

As described above, embedding the reinforcement member at least in the guide, the guide is hardly deformed in fitting the grommet to the corresponding opening. Therefore, in the grommet, the guide is prevented from being jammed in the sealing surface in fitting the grommet to the corresponding opening. In addition, since the grommet is fitted to the opening, being led by the guide, each grommet can be easily located in position. As a result, the number of times of reassemblage will be reduced and accordingly, productivity of the power converter can be enhanced.

(Sixth Embodiment)

Figure 14:
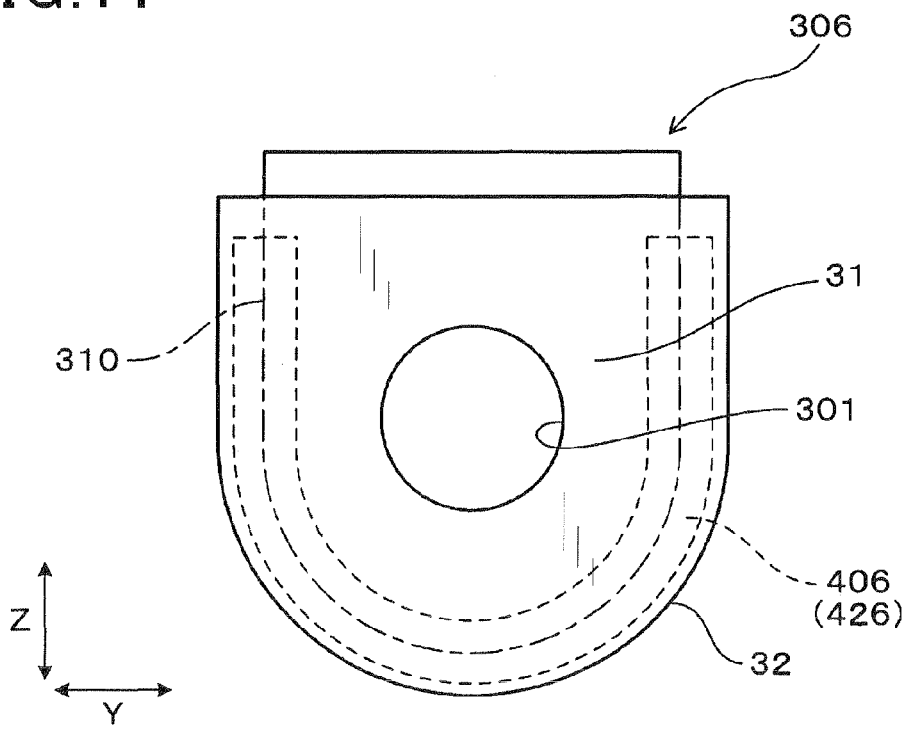
FIG. 14 is a plan view illustrating a grommet having a substantially U-shaped reinforcement member, according to a sixth embodiment of the present disclosure.
Figure 15:
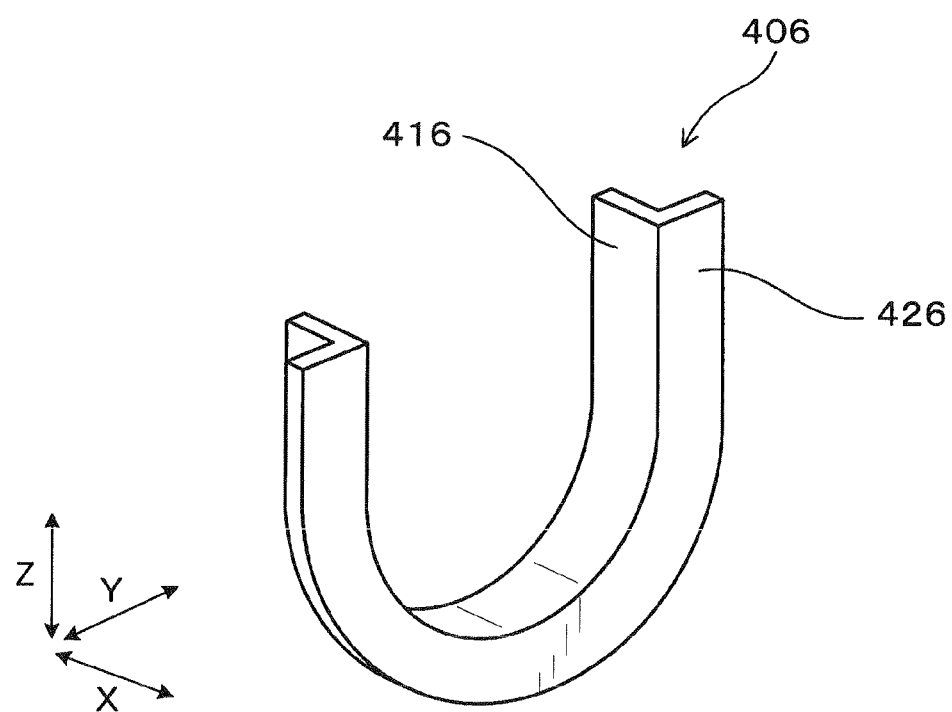
FIG. 15 is a perspective view illustrating the reinforcement member, according to the sixth embodiment.

Referring to FIGS. 14 and 15, a sixth embodiment of the present disclosure is described. FIG. 14 is a plan view illustrating a grommet 306 according to the sixth embodiment. FIG. 15 is a perspective view illustrating a reinforcement member 406 according to the sixth embodiment.

As shown in FIGS. 14 and 15, in the grommet 306 of the sixth embodiment, the reinforcement member 406 substantially in a U shape is used instead of the reinforcement member 4 of the first embodiment. As shown in FIGS. 14 and 15, the reinforcement member 406 of the present embodiment includes a sealing-surface mating portion 416 and a guide mating portion 426. The sealing surface-mating portion 416 is formed by bending a plate-like member into the shape of a U that goes along the sealing surface 310. The guide mating portion 426 is formed being projected outward (toward the guide 32 side) from the sealing-surface mating portion 416.

As shown in FIG. 14, the reinforcement member 406 is embedded in an elastic material, with the sealing-surface mating portion 416 being directed to the grommet body 31 and the guide mating portion 426 being located in the guide 32. Thus, the guide mating portion 426 is located in the grommet 306, being extended over both of the grommet body 31 and the guide 32. The rest of the to configuration is similar to that of the first embodiment.

As in the present embodiment, the reinforcement member does not necessarily have to be in an annular shape but may be in any shape if only the reinforcement member can be arranged in the guide. The reinforcement member in such a shape can exert an advantage of hardly deforming the guide in fitting each grommet to the corresponding opening.

In the first to sixth embodiments described above, a plurality of semiconductor modules and a plurality of cooling pipes are alternately stacked to configure a stack. Alternative to this, a configuration in which the semiconductor modules and the cooling pipes are not stacked may also be available. For example, each of the semiconductor modules may be configured such that a coolant can be passed therethrough, and such semiconductor modules as a cooling block may be placed in the casing.

The recess 211 is not limited to have a U shape but may have any shape, such as a rectangular shape or a V shape, if only the shape enables insertion of the coolant pipe.

In the power converter as described above, the grommet may be formed of any elastic material if only the material is a rubbery material having water-resistant properties and oil-resistant properties. For example, the elastic material used for the grommet may be a well-known material, such as ethylene-propylene rubber (EPDM), nitrile rubber, silicone rubber or fluororubber.

Regarding the reinforcement member which is made of metal, the metal is usually a ferrous material. However, the metal used for the reinforcement member is not limited to a ferrous material but may be any other metal having a strength of reinforcing the guide.

Further, the reinforcement member may be arranged, being extended over both of the guide and the grommet body.

In this case, the force of deforming the guide of each grommet in fitting the grommet to the corresponding opening can be dispersed to the grommet body. As a result, the guide will be hardly deformed and therefore water-tightness of the power converter will be more enhanced.

Also, the reinforcement member may include a cylindrical body located in the grommet body, and a flange projected outward from one end of the cylindrical body, and a part of the flange is located in the guide.

In this case, the flange is in a state of being bent from the cylindrical body. Accordingly, the strength of the reinforcement member is more enhanced and the guide can be more effectively reinforced. Being reinforced by the cylindrical body, the grommet body is more unlikely to be deformed. Accordingly, the grommet can contribute to enhancing the intimacy in the contact between the sealing surface of the grommet and the inner peripheral surface of the corresponding opening and between the inner peripheral surface of the corresponding through hole and the outer peripheral surface of the coolant charge/discharge pipe. As a result, the power converter will have more enhanced water-tightness.

As to the flange, the flange may be formed throughout a circumference at one end of the cylindrical body.

In this case, since the strength of the flange is more enhanced, deformation of the guide is minimized. As a result, the water-tightness of the power converter is more enhanced.

The guide may be arranged outside the casing.

In this case, the guide is arranged, covering the edge of the corresponding opening, as viewed from outside the casing. Accordingly, water-tightness of the power converter is more enhanced. Further, in this case, after fitting the grommets to the respective recesses, the guides can be easily confirmed not to have been deformed. As a result, the productivity of the power converter will be more enhanced.

The above-described casing may include a casing body and a casing cover which are assembled to each other, forming the pair of openings therebetween. The casing body has a mating surface via which the casing body is assembled to the casing cover and a pair of recesses are formed in the mating surface, each being cut into the shape of an L. Each of the guides is located along the curved surface at an end of the corresponding recess.

In this case, since each recess is in a shape having no corner, the intimacy in the contact is more enhanced between the sealing surface of the grommet and the inner peripheral surface of the recess. As a result, water-tightness of the power converter is more enhanced.

The invention claimed is:

1. A power converter comprising:
a semiconductor module;
a cooler that cools the semiconductor module, the cooler having a pair of coolant pipes that charges/discharges a coolant;
a casing provided with a pair of openings, housing the semiconductor module and the cooler in an interior thereof while having the pair of coolant pipes projected out of the pair of openings; and
a pair of grommets made of an elastic material, being fitted to the pair of openings where the pair of coolant pipes are inserted into the pair of grommets; wherein
the casing includes a casing body and a casing cover which are assembled to each other, forming the pair of openings therebetween;
the casing body has a mating surface via which the casing body is assembled to the casing cover;
a pair of recesses are formed in the mating surface, each being cut into the shape of a U;
each of the grommets includes:
a grommet body having a through hole through which a corresponding coolant pipe is inserted and a sealing surface which is configured to intimately contact an inner peripheral surface of a corresponding opening; and
a guide provided to one end of the grommet body, with respect to a direction of inserting the coolant pipe, so as to be projected outward further than the sealing surface, wherein
each of the grommets is embedded with a reinforcement member made of a ferrous material, with at least a part of the reinforcement member being located in the guide;
the reinforcement member is arranged, being extended over both of the guide and the grommet body and including a cylindrical body located in the grommet body, and a flange projected outward from one end of the cylindrical body, and a part of the flange is located in the guide;
the flange has a sole flat portion formed so as to be perpendicular to the radial direction of the cylindrical body; and
the sole flat portion and the casing cover are faced to each other.

2. The power converter according to claim 1, wherein the flange is formed throughout a circumference at one end of the cylindrical body.

3. The power converter according to claim 2, wherein the guide is arranged outside the casing.

4. The power converter according to claim 1, wherein the guide is arranged outside the casing.

* * * * *